United States Patent [19]
Martin et al.

[11] Patent Number: 5,654,858
[45] Date of Patent: Aug. 5, 1997

[54] OVERVOLTAGE CONTROL CIRCUITRY

[75] Inventors: Brian C. Martin, Los Almos; Alma Anderson, Rio Rancho; Harold G. Hanson, Albuquerque, all of N. Mex.

[73] Assignee: North American Philips Corporation, New York, N.Y.

[21] Appl. No.: 332,621

[22] Filed: Oct. 31, 1994

Related U.S. Application Data

[63] Continuation of Ser. No. 48,973, Apr. 19, 1993, abandoned.

[51] Int. Cl.⁶ .................................................. H02H 9/00
[52] U.S. Cl. .............................. 361/56; 361/91; 327/309
[58] Field of Search ............................ 361/18, 67, 86, 361/88, 90, 91, 98, 100, 101, 56, 118, 119; 307/490, 491, 495–497, 540, 542, 544, 548, 475, 473; 257/355–357, 370; 327/65, 309, 310, 312, 314, 334, 362, 363, 427

[56] References Cited

U.S. PATENT DOCUMENTS 4,789,917  12/1988  Miller ..................................... 361/56
4,963,766  10/1990  Lundberg ............................... 307/451
4,980,792  12/1990  Kertis et al. ............................. 361/91
5,160,855  11/1992  Dubberpuhl ............................ 307/270
5,300,835   4/1994  Assar et al. ............................. 307/475

*Primary Examiner*—Jeffrey A. Gaffin
*Assistant Examiner*—Ronald W. Leja
*Attorney, Agent, or Firm*—Brian J. Wieghaus

[57]  ABSTRACT

Output overvoltage protection circuitry for circuits operating at low voltages (e.g., 3 v) interfacing to a higher voltage operating circuit (e.g., 5 v bus). To prevent problems with a pull-up PMOS device at the output when the bus is pulled-up to the higher voltage, a voltage node is provided in the circuit which follows the output voltage or the low supply voltage, whichever is higher, and a sub-circuit is provided to generate logic signals indicating when the bus is pulled too high. The PMOS device is then shut-down to prevent damage to the circuit.

20 Claims, 3 Drawing Sheets

OVERVOLTAGE CONTROL CIRCUITRY

This is a continuation of application Ser. No. 08/048,973, filed Apr. 19, 1993, now abandoned.

This invention relates to overvoltage protection circuitry for integrated circuits (ICs), and in particular to protecting low-voltage circuits from overvoltages when coupled to higher-voltage circuits.

BACKGROUND OF THE INVENTION

As electronic systems make the transition from 5 to 3 volts, some parts of the system may operate with 3-volt DC power sources, whereas other parts of the system may operate with 5-volt power sources. As one example, 3-volt IC's are needed which can interface with 5-volt busses. Standard complementary MOS (CMOS) and combined bipolar-CMOS (BiCMOS) outputs run into trouble in these applications due to the PMOS devices in their pull-up circuitry.

Three major problems are encountered with such parts when the bus to which they are connected is pulled towards 5 volts: (1) the drain of the PMOS is pulled towards 5 volts and with its back gate fixed at 3 volts (or Vcc<5 volts) results in a forward biased p-n junction from output to Vcc creating very large, undesirable, output-to-Vcc currents; (2) the PMOS device, with its gate held to 3 volts (or Vcc<5 volts), cannot be turned off completely because the drain at the output has become the source, and the resulting gate-to-source voltage is greater than a threshold voltage drop again resulting in large, undesirable output-to-Vcc currents; and (3) some systems allow multiple chips to pull the bus high simultaneously, meaning that the PMOS could possibly be turned on creating, again, a very large positive output-to-Vcc current.

SUMMARY OF INVENTION

An object of the invention is overvoltage protection circuitry for IC circuits.

Another object of the invention is a low-voltage operating circuit provided with protection circuitry for protecting the low-voltage circuit against overvoltages when connected to higher voltage circuits.

A further object of the invention is CMOS or BiCMOS circuits adapted for operation at 3-volts but connected via pull-up circuitry to a 5-volt bus and provided with protection circuitry against overvoltages.

In accordance with one aspect of the invention, a voltage node is provided in the circuit to be protected, which node follows the DC supply voltage for the circuit or the circuit output voltage, whichever is greater. The signal voltage derived at this node can then be used to protect the circuit against an overvoltage. In a preferred embodiment, this voltage can be used to turn off a MOS device subject to the overvoltage and thereby prevent damage to the circuit.

In accordance with another aspect of the invention, means are provided coupled to the voltage node for providing complementary logic signals indicating when the output is pulled up above a certain value endangering the circuit to be protected. These logic signals can then be used to shut off a device to block transmittal of the overvoltage condition to the circuit to be protected.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there are illustrated and described the preferred embodiments of the invention.

DESCRIPTION OF THE PREFERRED EMBODIMENTS

Figure 1:
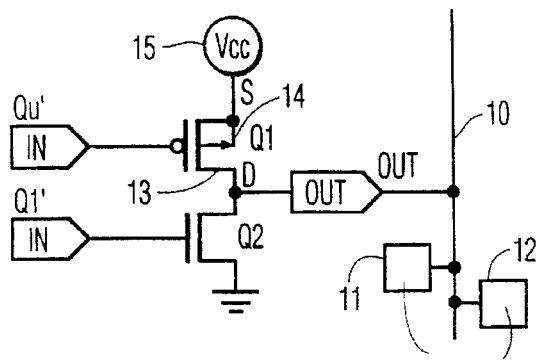
FIG. 1 shows a schematic of the simplified CMOS component of a standard CMOS and BiCMOS output stage.

FIG. 1 shows the simplified CMOS component of a standard CMOS and BiCMOS output stage, comprising serial-connected PMOS Q1 and NMOS Q2 transistors, with their common drain connected as an output, OUT, to a bus 10 to which other bus interface circuits 11, 12 are also connected. Connected to the gates of Q1 and Q2, respectively, are input signal Qu' and Q1'.

The notation used is as follows. The prime next to a signal is the same as a bar over the signal, meaning active low. NMOS is indicated by the upward half arrow; PMOS by the downward half arrow and the circle at the gate symbol. Vcc is the logic-high level, and Gnd the logic-low signal. Crossing conductors do not make connections at their crossings, except where they pass through a MOS gate or bipolar base.

If the output were in tri-state (Qu' at Vcc and Q1' at Gnd), and the bus 10 driven to 5 volts, then Q1 would have its p-type drain 13 at 5 volts and its n-type back gate 14 tied to its source at Vcc. For a part with a 3-volt Vcc 15, this would result in a forward-biased p-n junction from the output to Vcc.

Figure 2:
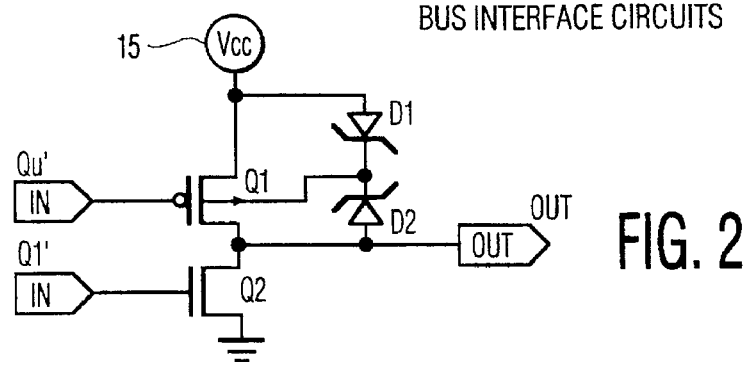
FIG. 2 shows a schematic of a variant of the FIG. 1 circuit.

One possible solution to this problem is shown in FIG. 2. Schottky diodes D1 and D2 form a follower circuit to keep the back gate of Q1, separated from its source, from ever being more than a Schottky drop below its source and drain. However, the back gate of Q1 would still be more than a threshold voltage drop below its source/drain at the output, resulting in a well-conducting channel from the 5-volt output to Vcc 15. Qu' would have to pull Q1's gate well within a MOS threshold of the output in order to completely shut it off. Furthermore, some systems allow multiple chips (see 11, 12 in FIG. 1) to pull the bus 10 high at once. If Q1 were to be pulling the output to its 3-volt Vcc 15 at the same time as another chip on the bus were pulling it to 5 volts, a "high contention" state would arise in which very large currents would pass from the output through Q1 into vcc.

Figure 3:
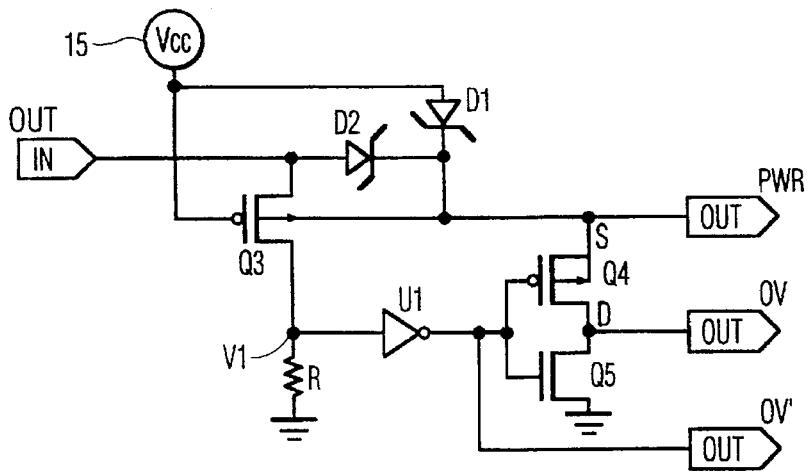
FIG. 3 shows a schematic of the overvoltage detecting or sensing part of one form of an overvoltage protection circuit in accordance with the invention.
Figure 4:
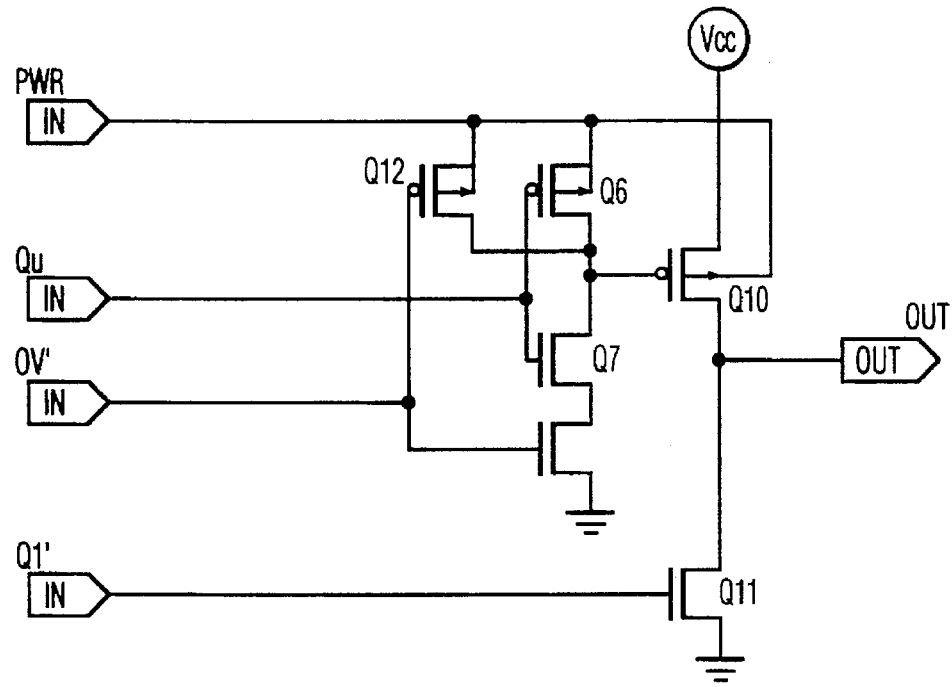
FIG. 4 shows a schematic of the output driver stage of one form of an overvoltage protection circuit in accordance with the invention.

The overvoltage protection circuit in accordance with the invention shown in FIGS. 3 and 4 provides a solution to these problems so that low voltage, e.g., 3-volt, CMOS and BiCMOS outputs can interface to a higher voltage, e.g., 5-volt, bus. Schottky diodes D1 and D2 provide at their junction an accessible voltage node, designated PWR, which can be used to protect the back gate of the pull-up PMOS device connected to the output OUT (FIG. 4). Furthermore, the sensing part of the circuit shown in FIG. 3 generates logic signals, OV and OV', that are complementary signals indicating when the output has been pulled approximately a MOS threshold above the local Vcc of the driver. As long as the output remains at Vcc or lower, a further PMOS FET Q3 remains entirely off, and node V1 is held at Grid through a resistance R, meaning that via inverter U1 and Q4/Q5 OV' is held to Vcc and OV to Gnd. As the output voltage (OUT in FIG. 4) increases and approaches a MOS threshold above Vcc, Q3 begins to conduct from the output into the V1 node, switching OV' low and OV high, thus indicating an "overvoltage condition". These signals can be used to logically shut off Q10 in the output driver in the case of a high contention, the state when the pull-up PMOS device Q10 is pulling its output up to 3-volt when another circuit connected to the same node is trying to pull its output up to 5-volt. For instance, FIG. 4 shows an example of a driver part of the circuit with OUT connected to the bus. Typically, OV' in FIG. 3 would be tied to OV' of FIG. 4, so that when OV' goes low, indicating high contention, Q10 (corresponding to Q1) will shut off. Q6 and Q7 function as a typical inverter, and together with Q12 form a logic gate. The PWR input from FIG. 3 to FIG. 4 protects the back gate of the PMOS transistors Q10, Q12, and Q6.

Since the source of Q4 (FIG. 3) is tied to the voltage node, PWR, instead of Vcc, when OV pulls high, it pulls all the way within a Schottky drop of the output. The same technique can be used to shut off Q10 as shown in FIG. 4. When Q1' goes low and Qu goes low to place the output OUT in tri-state, Q6 would be on and pulls up to within a Schottky voltage drop of whichever is at higher potential, the output OUT or Vcc, insuring that Q10 is shut off. In the example given, it is assumed that OUT in FIG. 4 and OUT in FIG. 3 are tied to the same potential, for example, a common bus, as would be used in a bidirectional transceiver bus interface circuit.

Figure 5:
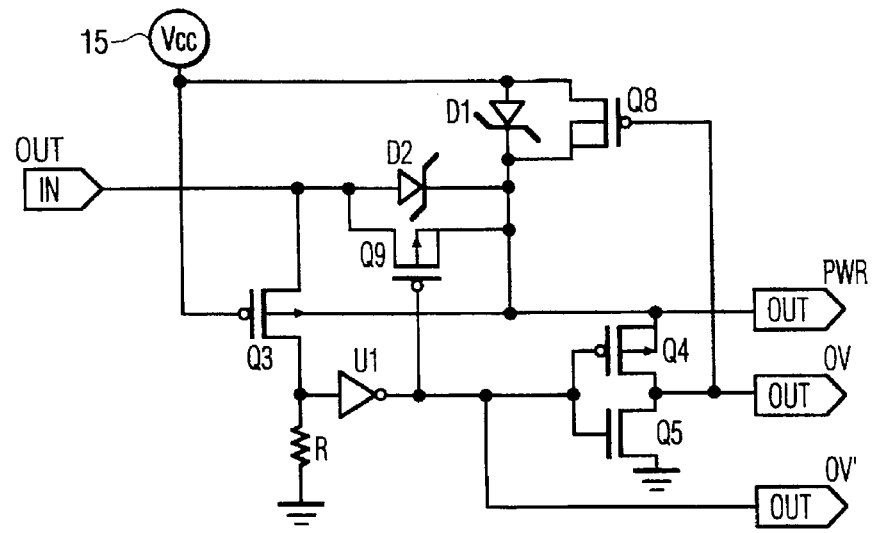
FIG. 5 shows a schematic of a variant circuit of the sensing part of an overvoltage protection circuit in accordance with the invention.

A shortcoming of the sensing circuit in FIG. 3 is that the diode D2 tends to capacitively couple the PWR node with the output OUT (FIG. 3). Thus, if the output, OUT, makes a 3-volt to Gnd transition, the node, PWR, tends to dip somewhat in voltage. That causes the gate of Q10 in FIG. 4, which is already a Schottky drop below Vcc in tri-state, to dip somewhat as well, allowing significant leakage through Q10. To avoid this problem, small PMOS devices, Q8 and Q9, are placed in parallel with the diodes D1 and D2, as shown in FIG. 5. In the case of normal operation, OV is low and Q8 (FIG. 5) provides a path to pull the PWR node all the way up to Vcc. In the overvoltage condition, OV goes high (turning off Q8) and OV' goes low turning on Q9, which gradually pulls the PWR node all the way up to the output voltage.

The overvoltage protection sensing circuitry in FIGS. 3 and 5 provide the voltage node and logic signals necessary to enable 3-volt CMOS and BiCMOS ICs to interface with a 5-volt bus. While the latter voltages are the ones most in used today, it will be appreciated that the invention is not limited to those particular values or to the systems illustrated, i.e., not necessarily to a bus environment, but is usable in and applicable to other systems or environments where lower voltage circuits have to interface to higher voltage circuits, or in general to circuits with different power supplies driving a common node.

Figure 6:
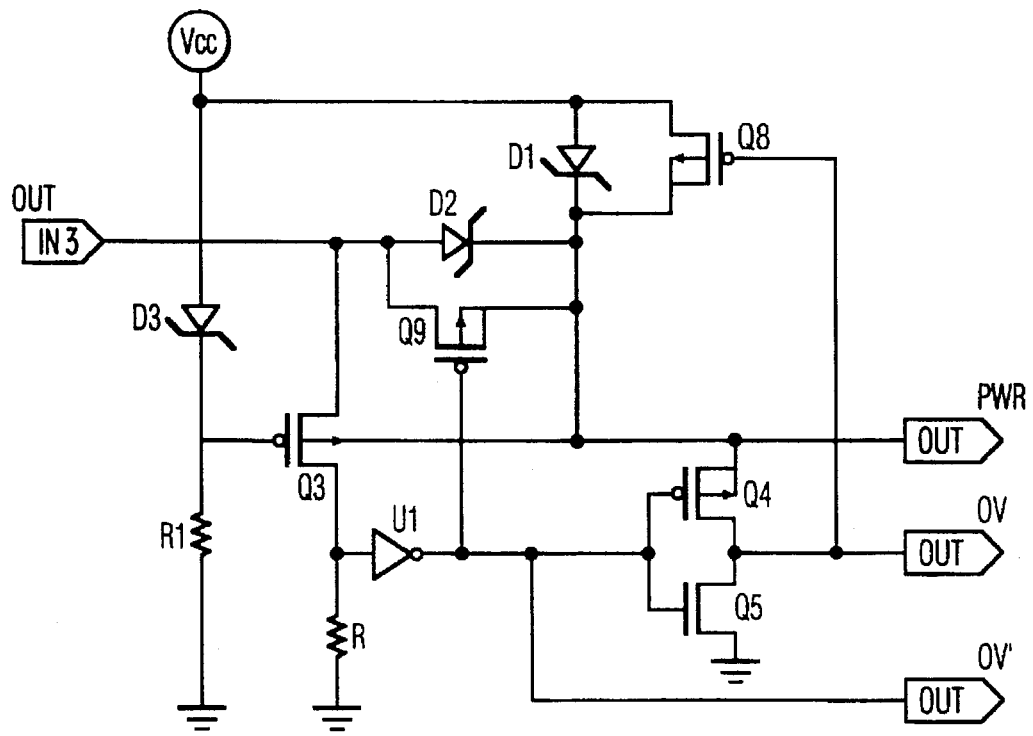
FIG. 6 shows a schematic of a further variant of the sensing part of an overvoltage protection circuit in accordance with the invention.

FIG. 6 is a variant of the FIG. 5 circuit with FIG. 6 using diode D3 and resistor R1 to set the voltage at the gate of Q3 a Schottky diode drop down from Vcc, so OUT does not have to go so high for Q3 to turn on. This circuit, however, will consume more static power through the diode D3 and resistor R1. The circuit otherwise operates the same as the FIG. 5 circuit.

Figure 7:
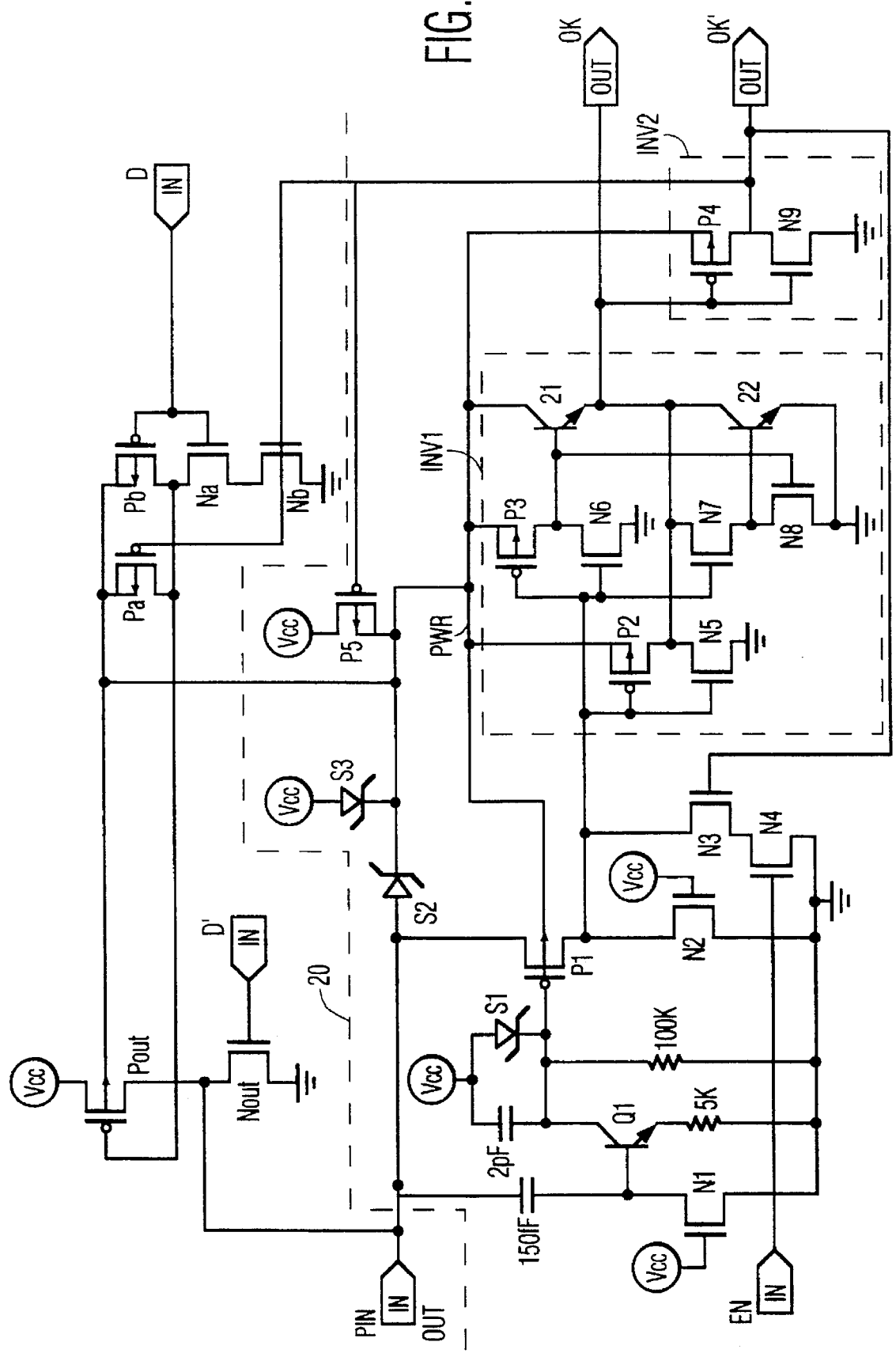
FIG. 7 shows a schematic of a circuit combining the sensing and driving parts of an overvoltage protection circuit in accordance with the invention.

FIG. 7 is an example in accordance with the invention which combines both the sensing and driving parts in a 3-volt bidirectional transceiver interface circuit of the BiCMOS type for interfacing to a 5-volt bus. In the example shown, D at the right side represents an input signal, EN at the left side an enable signal, and OK and OK' correspond respectively to OV' and OV in FIG. 6. The significant parts in the FIG. 7 circuit relevant to the invention and corresponding to parts in the FIG. 6 circuit are shown in the Table below:

TABLE

| FIG. 7 Part | corresponds to | FIG. 6 Part |
| --- | --- | --- |
| P1 | | Q3 |
| N2 | | R |
| P2/N5 | | Q4/Q5 |
| S3 | | D1 |
| S2 | | D2 |

The part below the dashed line 20 is the sensing part, and the part above the driver part.

In operation, Pout is the PMOS driver for the PIN OUT output. Pa, Pb, Na, and Nb function as a 2-input NAND gate. Assume input D is low. Pb would be on, turning Pout off. D' would be high, so Nout would pull the output OUT low. With OUT low below Vcc, the logic signals OK is high and OK' is low. Now assume D goes high. Pb turns off, Na turns on turning on Pout, which would pull the output OUT high. The OUT PIN is typically connected to a bus. If another part on the bus with a 5-volt Vcc pulls the output over the 3-volt Vcc of this circuit, OK would go low, and Pa would turn Pout off preventing damage to the circuit.

In the sensing part below the dashed line, N1 and N2 with Vcc on the gate act as resistors. The circuit designated INV1 functions as a standard BiCMOS inverter; the circuit designated INV2 functions as a standard MOS inverter.

While the invention has been described in connection with preferred embodiments, it will be understood that modifications thereof within the principles outlined above will be evident to those skilled in the art and thus the invention is not limited to the preferred embodiments but is intended to encompass such modifications.

What is claimed is:

1. An electronic device comprising:
   a first circuit operating with a lower supply voltage at a supply node, the first circuit having
      an input node for receiving an input signal;
      an output node for providing an output signal in response to the input signal; and
      an FET with a conduction channel coupled between the supply node and the output node, and with a gate and a back gate; and
   an overvoltage protection circuit coupled to the first circuit for protecting the first circuit against overvoltages when the output node is coupled to a second circuit operating with a higher voltage, the overvoltage circuit being coupled to at least one of said gates,
   characterized in that:

the overvoltage protection circuit comprises follower means for providing a voltage node to follow the higher of the output node or the lower supply voltage, means for coupling the voltage node to said one of said gates, and means for coupling the input node to the other of said gates, and the follower means comprises:
a first diode having an anode connected to the supply node and having a cathode connected to said one gate; and
a second diode having an anode connected to the output and having a cathode connected to the cathode of the first diode and to said one gate.

2. A device as claimed in claim 1, characterized in that said means for coupling the input node to the other of said gates comprises a logic gate.

3. A device as claimed in claim 1, characterized in that said one of said gates is the back gate.

4. A device as claimed in claim 3, characterized in that said means for coupling the input node to the other of said gates comprises a logic gate.

5. An electronic device comprising:
a first circuit operating with a lower supply voltage at a supply node, the first circuit having
an input node for receiving an input signal;
an output node for providing an output signal in response to the input signal; and
an FET with a conduction channel coupled between the supply node and the output node, and with a gate and a back gate; and
an overvoltage protection circuit coupled to the first circuit for protecting the first circuit against overvoltages when the output node is coupled to a second circuit operating with a higher voltage, the overvoltage circuit being coupled to at least one of said gates, characterized in that:
the overvoltage protection circuit comprises follower means for providing a voltage node to follow the higher of the output node or the lower supply voltage, means for coupling the voltage node to said one of said gates, and means for coupling the input node to the other of said gates, and
the follower means comprises:
a first Schottky diode having an anode connected to the supply node and having a cathode connected to said one gate; and
a second Schottky diode having an anode connected to the output and having a cathode connected to the cathode of the first diode and to said one gate.

6. A device as claimed in claim 5, characterized in that said means for coupling the input node to the other of said gates comprises a logic gate.

7. A device as claimed in claim 5, characterized in that said one of said gates is the back gate.

8. A device as claimed in claim 7, characterized in that said means for coupling the input node to the other of said gates comprises a logic gate.

9. An electronic device comprising:
a first circuit operating with a lower supply voltage at a supply node, the first circuit having
an input node for receiving an input signal;
an output node for providing an output signal in response to the input signal; and
an FET with a conduction channel coupled between the supply node and the output node, and with a gate and a back gate; and
an overvoltage protection circuit coupled to the first circuit for protecting the first circuit against overvoltages when the output node is coupled to a second circuit operating with a higher voltage, the overvoltage circuit being coupled to at least one of said gates,
characterized in that:
the overvoltage protection circuit comprises follower means for providing a voltage node to follow the higher of the output node or the lower supply voltage, means for coupling the voltage node to said one of said gates, and means for coupling the input node to the other of said gates,
the follower means comprises:
a first diode having an anode connected to the supply node and having a cathode connected to said one gate; and
a second diode having an anode connected to the output and having a cathode connected to the cathode of the first diode and to said one gate, and
said device further comprises means for providing at least one logic signal indicating that an overvoltage has been coupled to said output node, and means responsive to said logic signal for controlling said overvoltage protection circuit.

10. A device as claimed in claim 9, characterized in that said means responsive to said logic signal comprises a logic gate and is said means for coupling the input node to said other of said gates.

11. A device as claimed in claim 9, characterized in that said means responsive to said logic signal comprises means for pulling the voltage node closer to said lower supply voltage when an overvoltage has been coupled to said output node.

12. A device as claimed in claim 11, characterized in that said means for pulling the voltage node closer to said lower supply voltage comprises first and second by-pass FET's arranged in parallel with the first and second diodes, respectively, for being complementarily controlled by a logic gate means.

13. A device as claimed in claim 12, characterized in that said means for providing at least one logic signal indicating that an overvoltage has been coupled to said output node comprises a further FET arranged between the output node and a further node, the further FET having a first gate connected to the supply node and a second gate connected to the voltage node, one of said first and second gates being a back gate.

14. A device as claimed in claim 9, characterized in that said means for providing at least one logic signal indicating that an overvoltage has been coupled to said output node comprises a further FET arranged between the output node and a further node, the further FET having a first gate connected to the supply node and a second gate connected to the voltage node, one of said first and second gates being a back gate.

15. A device as claimed in claim 14, characterized in that said means responsive to said logic signal comprises a logic gate and is said means for coupling the input node to said other of said gates.

16. A device as claimed in claim 15, characterized in that said logic gate has a first input, a second input receiving said logic signal, and a gate supply node connected to the voltage node for supplying power to the logic gate means.

17. A device as claimed in claim 16, characterized in that said one of said gates is the back gate.

18. A device as claimed in claim 17, characterized in that said diodes comprise Schottky diodes.

19. A device as claimed in claim 18, characterized in that said means responsive to said logic signal comprises means for pulling the voltage node closer to said lower supply voltage when an overvoltage has been coupled to said output node.

20. A device as claimed in claim 19, characterized in that said means for pulling the voltage node closer to said lower supply voltage comprises a by-pass FET arranged in parallel with one of said diodes.

* * * * *